United States Patent
Hill et al.

(10) Patent No.: US 11,114,757 B2
(45) Date of Patent: Sep. 7, 2021

(54) EMBEDDED ANTENNA ARRAY METROLOGY SYSTEMS AND METHODS

(71) Applicant: Rockwell Collins, Inc., Cedar Rapids, IA (US)

(72) Inventors: Adrian A. Hill, Vinton, IA (US); Connor C. McBryde, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 302 days.

(21) Appl. No.: 16/147,457

(22) Filed: Sep. 28, 2018

(65) Prior Publication Data

US 2020/0076073 A1 Mar. 5, 2020

Related U.S. Application Data

(60) Provisional application No. 62/725,857, filed on Aug. 31, 2018.

(51) Int. Cl.
| | |
|---|---|
| *H01Q 3/26* | (2006.01) |
| *H04B 17/12* | (2015.01) |
| *H01Q 21/22* | (2006.01) |

(52) U.S. Cl.
CPC ............ *H01Q 3/267* (2013.01); *H01Q 21/22* (2013.01); *H04B 17/12* (2015.01)

(58) Field of Classification Search
CPC ........ H01Q 3/267; H04B 17/12; H01C 21/22; G01R 29/10; G01R 29/105
See application file for complete search history.

(56) References Cited

U.S. PATENT DOCUMENTS

| | | | | | |
|---|---|---|---|---|---|
| 4,176,354 | A * | 11/1979 | Hsiao | ............ | H01Q 3/267 342/173 |
| 5,086,302 | A * | 2/1992 | Miller | ............ | H01Q 3/267 342/173 |
| 5,253,188 | A * | 10/1993 | Lee | ............ | H01Q 3/267 343/808 |
| 5,294,934 | A * | 3/1994 | Matsumoto | ............ | H01Q 3/267 342/169 |
| 6,252,542 | B1* | 6/2001 | Sikina | ............ | H01Q 3/267 342/174 |
| 6,285,330 | B1* | 9/2001 | Perl | ............ | G01R 29/10 342/360 |
| 7,132,979 | B2* | 11/2006 | Langenberg | ............ | H01Q 3/267 342/368 |

(Continued)

*Primary Examiner* — Ankur Jain
(74) *Attorney, Agent, or Firm* — Suiter Swantz pc llo

(57) ABSTRACT

An antenna array testing circuit can include a circuitry including a plurality of memory registers, a testing sequence generation logic, and a testing control logic. The memory registers can store, for each antenna element of a plurality of antenna elements of the phased antenna array, a corresponding antenna element ID. The memory registers can store a testing step ID indicative of a testing step of a sequence of testing steps. The testing sequence generation logic can determine, for each antenna element of the phased antenna array, using the corresponding antenna element ID and the testing step ID, a corresponding testing signal indicative of a testing state of the antenna element during the testing step. The testing control logic can cause each antenna element the phased antenna array to be configured according to the corresponding testing signal during the testing step.

17 Claims, 8 Drawing Sheets

(56) References Cited

U.S. PATENT DOCUMENTS

| | | | |
|---|---|---|---|
| 7,482,976 B2* | 1/2009 | Piesinger | H01Q 3/267 |
| | | | 342/368 |
| 9,360,549 B1* | 6/2016 | Liu | H01Q 3/267 |
| 9,882,279 B2* | 1/2018 | Bull | H04W 16/28 |
| 10,348,272 B2* | 7/2019 | Zachara | H01Q 9/145 |
| 10,571,503 B2* | 2/2020 | Paulsen | H01Q 3/267 |
| 10,581,143 B2* | 3/2020 | Islam | H01Q 1/243 |
| 10,620,250 B2* | 4/2020 | Varel | H04B 17/21 |
| 2002/0070894 A1* | 6/2002 | Vail | H01Q 3/267 |
| | | | 342/368 |
| 2002/0093453 A1* | 7/2002 | Vail | H01Q 3/36 |
| | | | 342/372 |
| 2011/0267216 A1* | 11/2011 | Smith | G01S 13/781 |
| | | | 342/30 |
| 2017/0201019 A1* | 7/2017 | Trotta | H01Q 3/267 |
| 2018/0080967 A1* | 3/2018 | Lee | G01R 29/10 |
| 2019/0044623 A1* | 2/2019 | Rowell | H01Q 3/28 |
| 2019/0235003 A1* | 8/2019 | Paulsen | G01R 29/10 |
| 2019/0372218 A1* | 12/2019 | Vehovc | H01Q 3/34 |

* cited by examiner

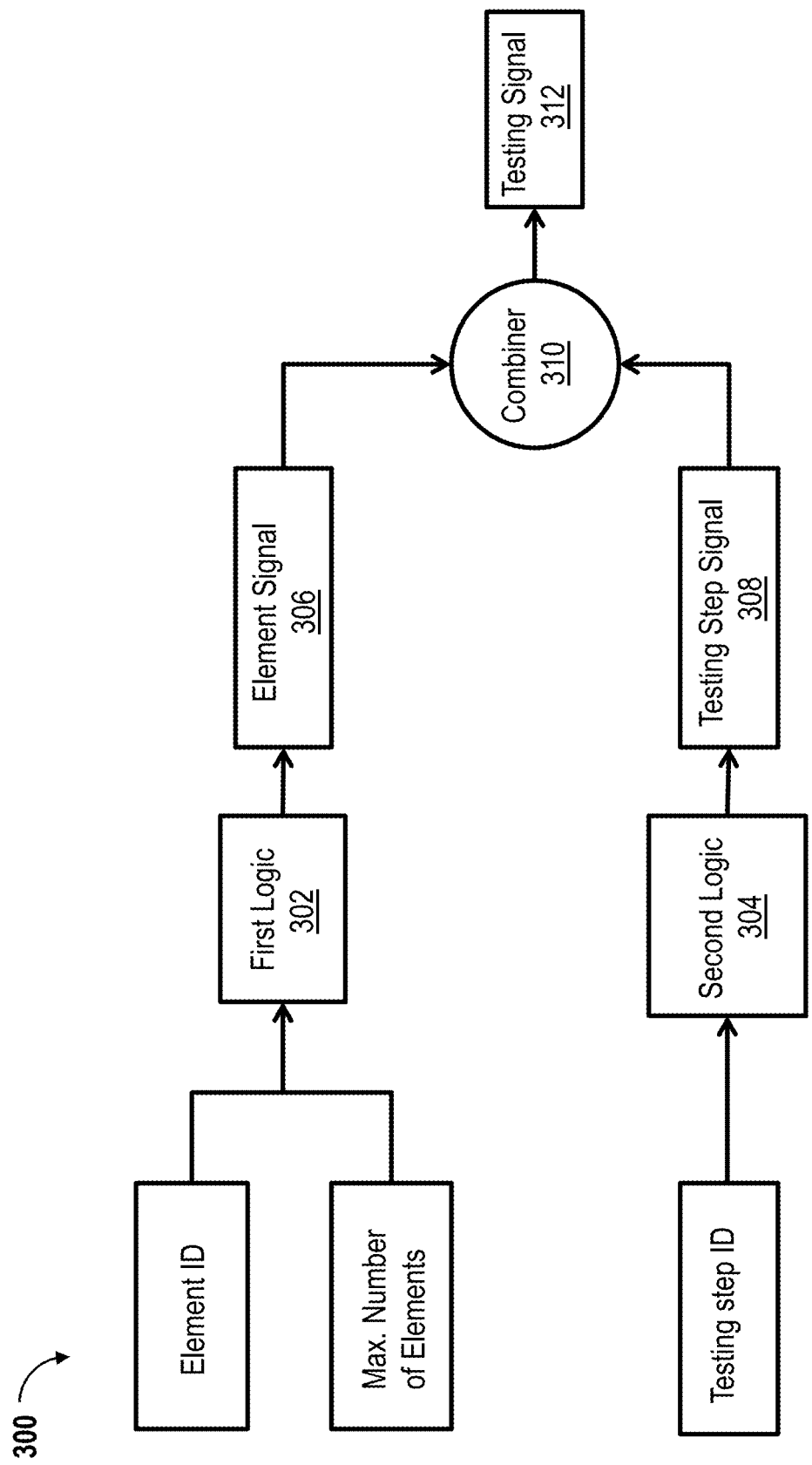

EMBEDDED ANTENNA ARRAY METROLOGY SYSTEMS AND METHODS

RELATED APPLICATIONS

This application claims priority from U.S. Provisional Application No. 62/725,857, filed Aug. 31, 2018, and entitled "EMBEDDED ANTENNA ARRAY METROLOGY SYSTEMS AND METHODS", which is incorporated herein by reference in its entirety.

BACKGROUND

Antennas produced for cost sensitive applications typically require testing and characterization before being put to use. Testing of an antenna is important for providing accurate measurements of the performance parameters of that antenna. It is very common and frequent that antennas do not perform as desired or as theoretically expected especially when designed to minimize production cost. As such, the antenna testing comes into play to measure or assess the actual performance metrics or parameters of antennas before using in the field. Measured performance metrics during the testing process can be used to calibrate the testing antennas before (or during) deployment.

For phased antenna arrays, performance parameters that are measured during testing can include gain and phase responses for various antenna elements. The testing process can be costly and time consuming. The cost of testing can be due to the cost of the testing equipment used, such as anechoic chambers, and the testing labor. Also, the time consuming nature of the testing process limits the number of phased antenna arrays that can be tested per unit time, and therefore, limit the volume of phased antenna arrays that can be produced and delivered for deployment.

Also, the accuracy of the measured calibration parameters can depend on the testing techniques used. For instance, testing techniques involving mechanical maneuvering (e.g., moving or rotating) of a phased antenna array to be tested or a probe antenna between various testing steps (or experiments) can lead to testing errors due to measurement errors associated with the mechanical maneuvering (e.g., errors in angle or distance measurement).

SUMMARY

In one aspect, embodiments of the inventive concepts disclosed herein are directed to an antenna array testing circuit for testing a phased antenna array. The antenna array testing circuit can include a plurality of memory registers, a testing sequence generation logic, and a testing control logic. The plurality of memory registers can store, for each antenna element of a plurality of antenna elements of the phased antenna array, a corresponding antenna element identifier (ID). The plurality of memory registers can store a testing step identifier (ID) indicative of a testing step of a sequence of testing steps. The testing sequence generation logic can be configured to determine, for each antenna element of the plurality of antenna elements of the phased antenna array, using the corresponding antenna element ID and the testing step ID, a corresponding testing signal indicative of a testing state of the antenna element during the testing step indicated by the testing step ID. The testing control logic can be configured to cause, each antenna element of the plurality of antenna elements of the phased antenna array, to be configured according to the corresponding testing signal during the testing step indicated by the testing step ID.

In a further aspect, the testing sequence generation logic can include a first logic and a second logic. The first logic can determine, for each testing step of the sequence of testing steps, a corresponding testing step signal using the testing step ID. The second logic can determine, for each antenna element of the plurality of antenna elements of the phased antenna array a corresponding antenna element signal using the corresponding antenna element ID. The testing sequence generation logic can generate, using the testing step signal and the corresponding antenna element signal, the corresponding testing signal indicative of a testing state of the antenna element during the testing step indicated by the testing step ID.

In a further aspect, the antenna array testing circuit can include a memory to store, for each testing step of the sequence of testing steps and for each antenna element of the plurality of antenna elements, a corresponding indication of the testing state of the antenna elements during the testing step. The testing sequence generation logic can retrieve, for each antenna element of the plurality of antenna elements, at each testing step of the sequence of testing steps, the corresponding indication of the testing state of the antenna element from the memory. The testing sequence generation logic can generate the corresponding testing signal indicative of the testing state of the antenna element during the testing step using the corresponding indication of the testing state of the antenna element.

In a further aspect, testing signals generated by the testing sequence generation logic and indicative of testing states of the plurality of antenna elements of the phased antenna array across the sequence of testing steps can represent a testing matrix. The antenna array testing circuit can be integrated in a beamformer integrated circuit of the phased antenna array. The testing state of the antenna element can be indicative of at least one of a gain, a time delay, and a phase shift to be applied to the antenna element. The plurality of memory registers can store, for each antenna element of the plurality of antenna elements of the phased antenna array, at least one of a corresponding phase shift, a corresponding time delay, and a corresponding gain.

In a further aspect, the plurality of memory registers can store a testing control value indicative of whether the phased antenna array is in a nominal state (during normal use of the phased antenna array) or a testing state (when being tested or configured to be tested). The testing control logic can be configured to receive the testing control value. The testing control logic can allow configuration of the plurality of antenna elements of the phased antenna array if the testing control value is indicative of a testing state, otherwise prevent configuration of the plurality of antenna elements of the phased antenna array.

In a further aspect, the antenna array testing circuit can include an increment condition detector logic. The increment condition detector logic can detect occurrence of a predefined condition. The increment condition detector logic can cause the testing step ID to be modified to refer to another testing step of the plurality of testing steps, upon detecting the occurrence of the predefined condition.

In one aspect, embodiments of the inventive concepts disclosed herein are directed to a method of testing phased antenna arrays. The method can include storing, by an integrated circuit, for each antenna element of a plurality of antenna elements of the phased antenna array, a corresponding antenna element identifier (ID). The method can include the plurality of memory registers storing a testing step identifier (ID) indicative of a testing step of a sequence of testing steps. The method can include determining, by an integrated circuit, for each antenna element of the plurality of antenna elements of the phased antenna array, using the corresponding antenna element ID and the testing step ID, a corresponding testing signal indicative of a testing state of the antenna element during the testing step indicated by the testing step ID. The method can include the integrated circuit causing each antenna element of the plurality of antenna elements of the phased antenna array to be configured according to the corresponding testing signal during the testing step indicated by the testing step ID.

In a further aspect, the method can include the integrated circuit determining, for each testing step of the sequence of testing steps, a corresponding testing step signal using the testing step ID. The method can include the integrated circuit determining, for each antenna element of the plurality of antenna elements of the phased antenna array a corresponding antenna element signal using the corresponding antenna element ID. Generating the corresponding testing signal indicative of the testing state of the antenna element during the testing step indicated by the testing step ID can include generating the corresponding testing signal using the testing step signal and the corresponding antenna element signal.

In a further aspect, the method can include storing, in a memory, for each testing step of the sequence of testing steps and for each antenna element of the plurality of antenna elements, a corresponding indication of the testing state of the antenna elements during the testing step. The method can include the integrated circuit retrieving, for each antenna element of the plurality of antenna elements, at each testing step of the sequence of testing steps, the corresponding indication of the testing state of the antenna element from the memory. The method can include the integrated circuit generating the corresponding testing signal indicative of the testing state of the antenna element during the testing step using the corresponding indication of the testing state of the antenna element.

In a further aspect, the integrated circuit can include a beamformer integrated circuit of the phased antenna array. The testing state can be indicative of at least one of a gain, a time delay, and a phase shift to be applied to the antenna element. The method can include the plurality of memory registers storing, for each antenna element of the plurality of antenna elements of the phased antenna array, at least one of a corresponding phase shift, a corresponding time delay, and a corresponding gain.

In a further aspect, the method can include the plurality of memory registers storing a testing control value indicative of whether the phased antenna array is in a nominal state or a testing state. The method can further include retrieving the testing control value from the plurality of the memory registers, and allowing configuration of the plurality of antenna elements of the phased antenna array if the testing control value is indicative of a testing state, otherwise preventing configuration of the plurality of antenna elements of the phased antenna array.

In a further aspect, the method can include the integrated circuit detecting occurrence of a predefined condition, and causing the testing step ID to be modified to refer to another testing step of the plurality of testing steps, upon detecting the occurrence of the predefined condition.

In one aspect, embodiments of the inventive concepts disclosed herein are directed to a phased antenna array. The phased antenna array can include a plurality of antenna elements, a plurality of memory registers, a testing sequence generation logic, and a testing control logic. The plurality of memory registers can store, for each antenna element of the plurality of antenna elements of the phased antenna array, a corresponding antenna element identifier (ID). The plurality of memory registers can store a testing step identifier (ID) indicative of a testing step of a sequence of testing steps. The testing sequence generation logic can be integrated in the integrated circuit of the phased antenna array and can be configured to determine, for each antenna element of the plurality of antenna elements of the phased antenna array, using the corresponding antenna element ID and the testing step ID, a corresponding testing signal indicative of a testing state of the antenna element during the testing step indicated by the testing step ID. The testing control logic can be integrated in the integrated circuit of the phased antenna array, and can be configured to cause each antenna element of the plurality of antenna elements of the phased antenna array, to be configured according to the corresponding testing signal during the testing step indicated by the testing step ID.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 3 shows a block diagram of an example implementation of a testing sequence generation logic is shown, according to inventive concepts of this disclosure;

Figure 1:
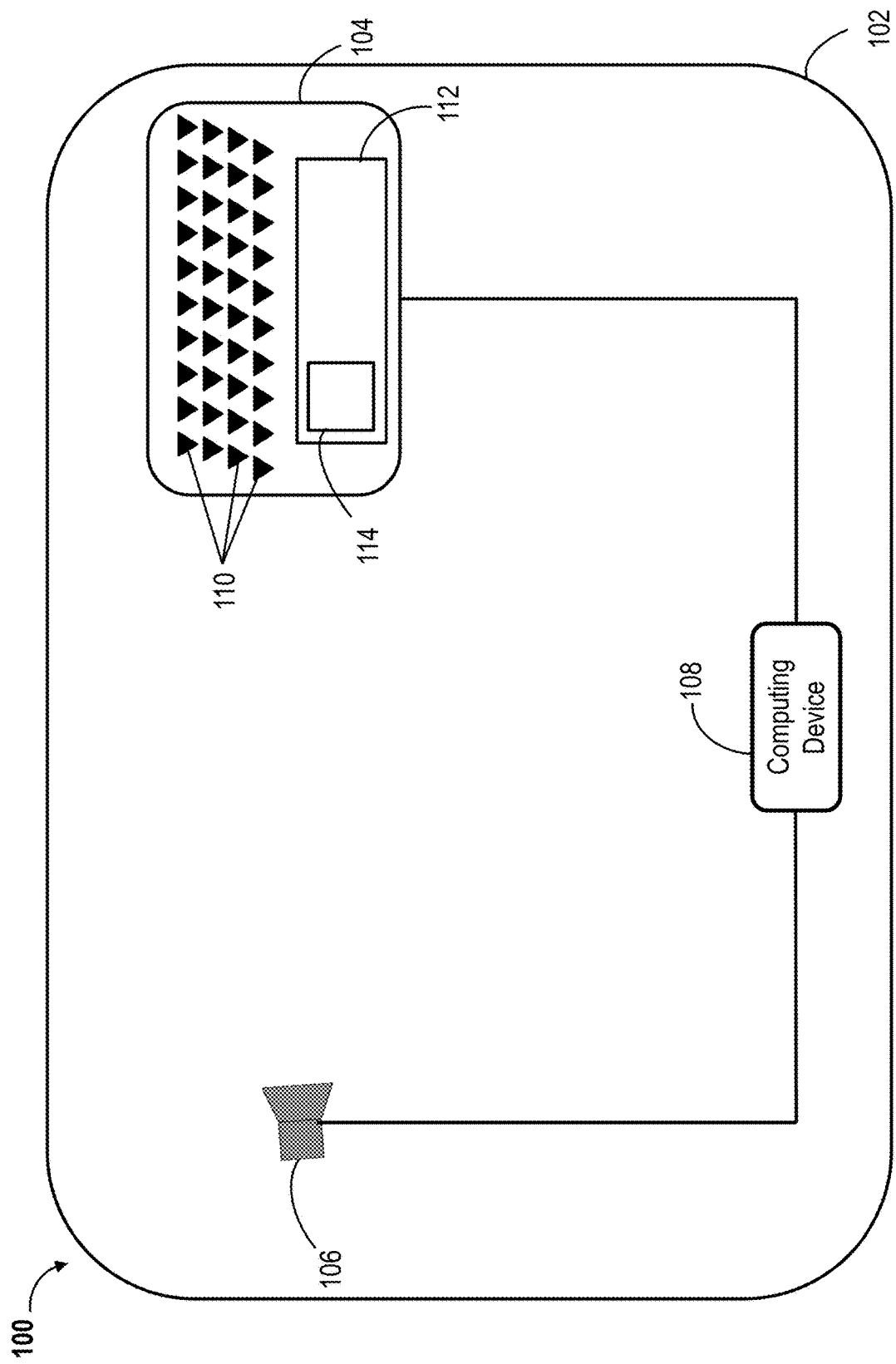
FIG. 1 shows a block diagram of a phased antenna array testing system, according to inventive concepts of this disclosure.

The details of various embodiments of the methods and systems are set forth in the accompanying drawings and the description below.

DETAILED DESCRIPTION

Before describing in detail embodiments of the inventive concepts disclosed herein, it should be observed that the inventive concepts disclosed herein include, but are not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

When manufactured, a phased antenna array can be designed to have specific performance parameters (or radio characteristics) such as gain (G), directivity, radiation pattern, beam width, radiated power (or effective isotropic radiated power (EIRP)), cross polarization discrimination, gain-to-noise-temperature (G/T), error vector magnitude (EVM), adjacent channel power ratio (ACPR), pulse quality, side lobe levels, signal-to-noise ratio (SNR), or a combination thereof. However, due to manufacturing and/or design errors, the phased antenna array may not perform as desired and the actual performance parameters of the phased antenna array may be different from the corresponding theoretical performance parameters defined, for example, during the design process of the phased antenna array. Phased antenna array testing processes allow for measuring the actual performance parameters (or radio characteristics) of manufactured phased antenna arrays before deployment.

Conventional phased antenna array testing methods and systems usually involve using relatively large radio frequency (RF) anechoic chambers to allow for testing of the far field response of phased antenna arrays. The conventional testing methods and systems also typically involve moving mechanical parts (e.g., motors) between different positions in a given RF anechoic chambers to allow for testing a phased antenna array at various near field or far field scenarios. Moving the mechanical parts reduces the speed, and adds to the complexity, of the testing process. For instance, the time required to position the phased antenna (e.g., using a motor) array takes significantly more time than measuring the array parameters once positioned.

Other phased antenna array testing techniques described in the U.S. patent application Ser. No. 15/885,362 filed on Jan. 13, 2018, and entitled "METHODS AND SYSTEMS FOR ESA METROLOGY" apply various antenna testing configurations to the phased antenna array during the testing process, for example, instead of rotating or moving the phased antenna array. These testing techniques or the corresponding testing equipment are referred to herein as the Fast Antenna Test Environment (FATE). Each testing configuration can include one or more corresponding gain values, one or more corresponding phase shift values, one or more time delay values, or a combination thereof to be applied to the phased antenna array or the respective antenna elements during a corresponding testing step of a sequence of testing steps. FATE can include a central controller for uploading the testing configurations or the corresponding parameters (e.g., gain values, phase shift values, time delay values or a combination thereof) to one or more beamformer RF integrated circuits (RFICs) of the phased antenna array.

While FATE allows for improved testing speed compared to conventional phased antenna array testing techniques, FATE performance is highly dependent on the speed at which the central controller uploads the testing configurations to the beamformer RFICs. For instance, the bus write time, or time to upload the configuration parameters to the beamformer RFICs, at each testing step is substantially longer than the time to test the phased antenna array with such parameters. Also, for a phased antenna array with N antenna elements (N is an integer), FATE usually involves N testing steps where configuration parameters for the N antenna elements are uploaded in each step. As such, the communication time (or data uploading time) between the central controller and the phased antenna array during the testing process of an array with N elements is proportional to N2. Consequently, as the number of antenna elements N per antenna array gets larger, the testing time per antenna array increases substantially and the testing throughput (e.g., number of tested antenna arrays per unit time) decreases significantly.

For example, FATE can achieve a testing time of 28 seconds for an antenna array having 2048 antenna elements. Out of the 28 seconds, the communication time (or time of uploading data to the beamformer RFICs) is estimated to be 18 seconds for N2 writes. Reducing the data write (or data uploading) complexity, for example, by a factor of N (e.g., 2048) results in a communication time of 9 ms (milliseconds) for the antenna array having 2048 antenna elements, and reduces the testing time to 10 seconds for the whole testing process, including the time to transfer testing data between a vector network analyzer (VNA) and a computing device.

Methods and systems described herein allow improved phased antenna array testing speed. The methods and systems described herein allow for a communication speed reduction by a factor of N, where N represents the number of antenna elements in the tested phased antenna array. Specifically, the methods and systems described herein allow for a reduction in the time used to upload the configuration parameters to antenna elements of phased antenna arrays being tested.

Referring now to the drawings, FIG. 1 shows a diagram illustrating an example embodiment of a phased antenna array testing environment 100, according to inventive concepts of this disclosure. In brief overview, the phased antenna array testing environment 100 can include an antenna testing chamber 102, phased antenna array 104, a probe antenna 106, and an antenna testing control system 108 communicatively coupled to the phased antenna array 104 and the probe antenna 106. The phased antenna array 104, the probe antenna 106, and the antenna testing control system 108 can be arranged within the antenna testing chamber 102. The phased antenna array 104 can include a plurality of antenna elements 110, a beamformer integrated circuit (IC) 112, and antenna array testing circuit 114. The antenna testing control system 108 and the probe antenna 108 can be viewed as forming a phased antenna array testing system for testing the phased antenna array 104. While FIG. 1 shows a single probe antenna 106 being used, the phased antenna array testing system can include a plurality of probe antenna 106, for example, associated with different positions with respect to the phased antenna array 104, distinct polarizations, various operating frequencies (or frequency bands), or a combination thereof. Also, the phased antenna array testing system can be used to test a plurality of phased antenna arrays 104, for example, as discussed in the U.S. patent application Ser. No. 15/885,362 filed on Jan. 13, 2018, and entitled "METHODS AND SYSTEMS FOR ESA METROLOGY."

The antenna testing chamber 102 can include a radio frequency (RF) anechoic chamber. A RF anechoic chamber can be a room designed to substantially absorb reflections of electromagnetic waves radiated by the phased antenna array 104 or the probe antenna 104. For instance, the walls, ceiling and floor of the RF anechoic chamber can be made of or lined with electromagnetic wave absorbing material. The walls and ceiling of the RF anechoic chamber can also be designed to block electromagnetic waves in the surrounding environment from penetrating into the RF anechoic chamber. The testing chamber 102 can be sized to host the phased antenna array testing system and the phased antenna array 104 to be tested. For instance, the size of the testing chamber 102 can be defined based on the sizes of components of the phased antenna array testing system, the size of the phased antenna array(s) 104 to be tested, the number of phased antenna array(s) to be tested (e.g., per a given time duration), the distance(s) between the phased antenna array(s) 104 and the probe antenna(s) 106, or a combination thereof. In some implementations, the phased antenna array testing system and the phased antenna array(s) 104 to be tested can be arranged in open space (or outdoor), for example, with an electromagnetic wave absorbing material can be laid on a portion of the ground between the phased antenna array 104 and the probe antenna 106 to prevent or mitigate reflections off/from the ground.

The process of testing the phased antenna array 104 allows for measuring the actual performance parameters (or radio characteristics) of the phased antenna array 104, such as gain (G), directivity, radiation pattern, beam width, radiated power (or effective isotropic radiated power (EIRP)), cross polarization discrimination, gain-to-noise-temperature (G/T), error vector magnitude (EVM), adjacent channel power ratio (ACPR), pulse quality, side lobe levels, signal-to-noise ratio (SNR), or a combination thereof, which may be different from the corresponding theoretical performance parameters defined, for example, during the design process of the phased antenna array 104. During the testing process, the phased antenna array 104 can operate (or act) as the transmitting antenna while the probe antenna 106 can operate as the receiving antenna, or vice versa. For instance, the antenna testing control system 108 may provide specific transmit (TX) signals to the phased antenna array 104 for transmission (or to be radiated as electromagnetic waves), and the probe antenna 108 can receive, responsive to the electromagnetic waves, corresponding receive (RX) RF signals. Alternatively, the antenna testing control system 108 may provide the transmit (TX) signals to the probe antenna 106 for transmission (or to be radiated as electromagnetic waves), and the phased antenna array 104 can receive, responsive to the electromagnetic waves, corresponding RX signals.

The probe antenna 106 can include a horn antenna, a loop probe antenna, a rectangular antenna, a dipole antenna probe, or other type of antenna known to a person skilled in the art. The probe antenna 106 can be single polarized or dual polarized. The probe antenna 106 may be arranged at a fixed (or predefined) position and/or a fixed (or predefined) orientation relative to the phased antenna array 104. In some implementations, a plurality of probe antennas arranged at a plurality of positions and/or orientations relative to the phased antenna array 104 may be used in the testing process.

The antenna testing control system 108 can include a vector network analyzer (VNA), a computing device, or a combination thereof (both are not shown in FIG. 1). The antenna testing control system 108 can receive RX signals from the receiving antenna (e.g., phased antenna array 104 or probe antenna 106), and analyze the RX signals to determine (or compute) one or more actual performance parameters of the phased antenna array 104 and/or calibration parameters (e.g., gain calibration values, phase shift calibration values, or a combination thereof) for the antenna elements 110 of the phased antenna array 104 to be applied when the phased antenna array is in normal (or nominal) operation mode.

In the phased antenna array 104, the beamformer IC 112 can be communicatively coupled to the plurality of antenna elements 110. The beamformer IC 112 can include a receiver (RX) beam forming feed network to allow for steering beams received by the phased antenna array 104 (RX beams), a transmitter (TX) beam forming feed network to allow for steering beams transmitted by the phased antenna array 104 (TX beams), or a combination of both (both are not shown in FIG. 1). The beam forming feed network(s) can allow for applying separate phase shifts, separate time delays, separate gains, or a combination of both to separate antenna elements 110 (or groups of antenna elements). The beam forming feed network(s) can include a plurality of phase shifters (or time delay lines), a plurality of RF amplifiers, one or more power splitters, one or more power combiners, or a combination thereof.

The phased antenna array 104 can include the antenna array testing circuit 114. The antenna array testing circuit 114 can be configured to control testing of the phased antenna array 104. The testing process can include a testing sequence having a plurality (e.g., M where M is an integer greater than or equal to the number of antenna elements 110 in the phased antenna array 104) of testing steps (or testing experiments). In each testing step, the antenna array testing circuit 114 can determine and apply to the plurality of antenna elements 110 a corresponding set of testing states (e.g., testing gain values, testing phase shift values, or a combination thereof). The phased antenna array 104 can be tested (e.g., RF signals or electromagnetic waves are transmitted between the phased antenna array and the probe antenna 106 and performance metric measurements are collected by the antenna testing control system 108) during each testing step while the corresponding set of testing states is applied to the plurality of antenna elements 110. The antenna array testing circuit 114 can be integrated (or embedded) in the beamformer IC 112. The antenna array testing circuit 114 may be implemented as a separate IC (e.g., separate from the beamformer IC 112) that is communicatively coupled to the beamformer IC 112. The antenna array testing circuit 114 and the beamformer IC 112 can be implemented on a single printed circuit board (PCB) or separate PCBs that are communicatively coupled to each other. Having the antenna array testing circuit 114 embedded (or integrated) within the beamformer IC 112 and both circuits implemented on a single PCB can provide for a compact and efficient implementation with a relatively higher testing speed (or lower testing time) compared to, for example, implementing the beamformer IC 112 and the antenna array testing circuit 114 as separate ICs.

Figure 2:
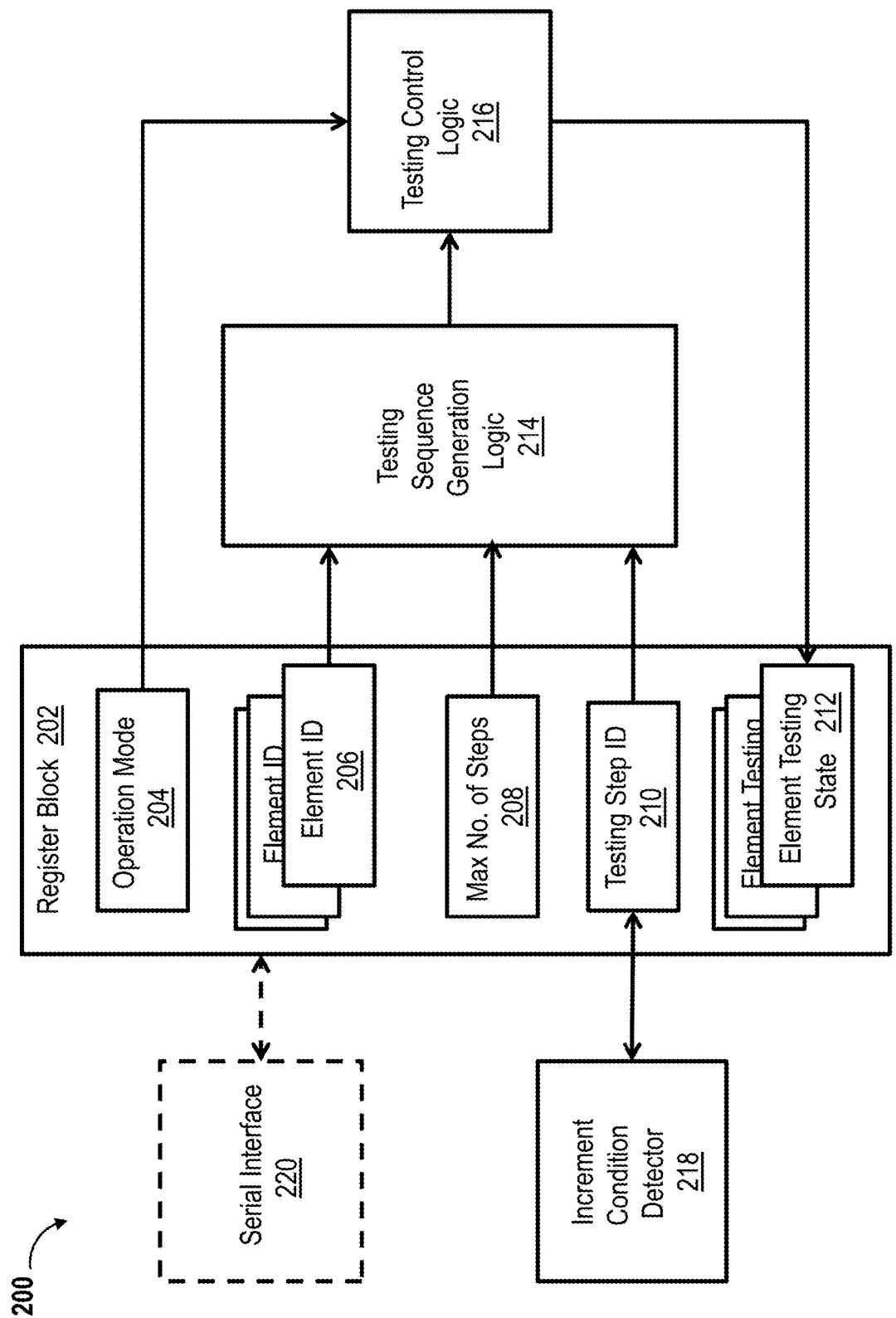
FIG. 2 shows an example block diagram of an antenna array testing circuit, according to inventive concepts of this disclosure.

Referring to FIG. 2, an example block diagram of an antenna array testing circuit 200 is shown, according to inventive concepts of this disclosure. In brief, the antenna array testing circuit 200 can include a register block (or circuitry) 202 including a plurality of memory registers (or memory elements) such as memory registers 204-212, a testing sequence generation logic 214, a testing control logic 216, and an increment condition detector (or an incrementing component) 218. The antenna array testing circuit 200 can further include (or can be communicatively coupled to) a serial interface 220 for exchanging data with other devices or other devices or other circuit components (e.g., circuit components of the beamformer IC 112 shown in FIG. 1). As used herein, a memory element is a memory component capable of storing one or more bits of information.

Referring to FIGS. 1 and 2, the phased antenna array 102 can include a plurality of an antenna array testing circuits 200, where each antenna array testing circuit 200 can be associated with a respective subset of the antenna elements 110 of the phased antenna array 102. The register block 202 can include a memory register 204 for storing an indication (e.g., 1 bit value) of the operation mode, also referred to herein as a testing control value, of the phased antenna array 104. The phased antenna array can be in a testing mode or a nominal (or normal operation) mode. The register block 202 can include a plurality of memory registers 206 for storing identifiers (IDs) of the antenna elements 110. For instance, for each antenna element 110, one or more memory registers 110 can store the corresponding antenna element ID. For each antenna element 110, the corresponding antenna element ID can include, for example, a single number identifying that antenna elements 110 or multiple numbers, e.g., a row number and a column number for that antenna element 110. The register block 202 can include a memory register 208 to store the maximum number of testing steps (or maximum number N of antenna elements in the phased antenna array 104) that can be supported by the antenna array testing circuit 200. As such, the antenna array testing circuit 200 can be used within (or for testing) any phased antenna array having a corresponding number of antenna elements less than or equal to the maximum number of testing steps. The register block 202 can include a memory register 210 to store the testing step ID (e.g., testing step number) for the current testing step being carried out. Each testing step of the testing sequence can be associated with a corresponding testing step ID.

The register block 202 can include a plurality of memory registers 212 for storing, for each antenna element 110, one or more corresponding testing states. The one or more corresponding testing states can represent potential testing states that can be applied to that antenna element 110 throughout various testing steps. For each antenna element 110, the one or more corresponding testing states can include, for example, ON and OFF states to indicate, for example, whether the antenna element 110 is to be turned ON or turned OFF or what gain to apply to the antenna element 110. For example, the ON state can correspond to a relative high gain value while the OFF state can correspond to a relatively low gain value. The one or more potential testing states for each antenna element 110 can include, for example, at least one of a testing gain value and a testing phase shift value (or testing time delay value) to be applied to that antenna element 110. Each testing state of the potential testing states of a given antenna element 110 can include a corresponding testing gain value, a corresponding testing phase shift value, a corresponding testing time delay value, or a combination thereof that can be applied to that antenna element 110 during one or more of the testing steps of the testing sequence. An antenna element 110 may be associated with various ON states, each of which can be associated with a corresponding testing gain value, a corresponding testing phase shift value, or a combination thereof.

During each testing step of the testing sequence, the testing sequence generation logic 214 can receive (or retrieve) from the memory register 210 the testing step ID of the testing step. The testing sequence generation logic 214 can further receive (or retrieve), during each testing step and for each antenna element 110, the corresponding antenna element ID from the memory registers 206. The testing sequence generation logic 214 may further receive (or retrieve), during each testing step, the maximum number of steps from the memory register 208. The testing sequence generation logic 214 can determine, at each testing step and for each antenna element 110 of the phased antenna array 104, a corresponding testing signal indicative of a testing state of the antenna element 110 during the testing step indicated by the testing step ID, using the corresponding antenna element ID and the testing step ID. The testing signal can include a binary code, another type of code, a digital electric signal, an analog electric signal, or a combination thereof. The testing sequence generation logic 214 may further use the maximum number of steps in determining the testing signal (or testing state signal) for antenna element 110 at each testing step. The maximum number of steps can be hardcoded within the testing sequence generation logic 214 or may be received (or retrieved) from the memory register 208.

The testing sequence generation logic 214 can implement a function or mapping to map each pair of a testing step ID and an antenna element ID to a corresponding antenna element state (or a testing state signal of the antenna element associated with the antenna element ID) at the testing step identified by the testing step ID. For instance, the an antenna array testing circuit 200 can include a memory to store, for each testing step of the sequence of testing steps and for each antenna element 110 of the phased antenna array 104, a corresponding indication of the testing state of the antenna element during the testing step. For example, can store a look-up table that maps each (testing step ID, antenna element ID) pair to a corresponding testing state (or testing state signal) of the antenna element identified by the antenna element ID at the testing step identified by the testing step ID. The testing sequence generation logic 214 can retrieve, at each testing step of testing sequence and for each antenna element 110 of the phased antenna array 104, the corresponding indication of the testing state of the antenna element 110 from the memory (e.g., from the look-up table). The testing sequence generation logic 214 can generate the corresponding testing signal indicative of the testing state of the antenna element 110 identified by the antenna element ID during the testing step identified by the testing step ID using the corresponding indication of the testing state of the antenna element 110.

Referring to FIG. 3, a block diagram of an example implementation 300 of the testing sequence generation logic 214 of FIG. 2 is shown, according to inventive concepts of this disclosure. The testing sequence generation logic 300 can include a first logic 302 and a second logic 304. The first logic 302 can receive an antenna element ID of a corresponding antenna element 110, for example, from a memory register 206 and a number indicative of the maximum number of elements supported, for example, from the memory register 208. The first logic 302 can determine (or generate) an antenna element signal 306 using the received antenna element ID and the maximum number of elements supported. In some implementations, the maximum number of antenna elements supported may be hardcoded (or maintained) by the first logic 302. The second logic can receive the testing step ID (e.g., for a current testing step), and generate a testing step signal corresponding to the testing step ID. The antenna element signal and the testing step signal can include binary codes, other types of codes, electric signals, or a combination thereof.

The testing sequence generation logic 300 can include a combiner component 310 that can receive the antenna element signal 306 generated by the first logic 302 and the testing step signal 308 generated by the second logic 304. The combiner component 310 can determine (or generate) a testing signal (or a testing state signal) 312 or identify a testing state of the antenna element identified by the antenna element ID at the testing step identified by the testing step ID, using the antenna element signal 306 and the testing step signal 308. For example, the combiner component 310 can apply a logic AND, logic OR, logic NAND, logic XOR, other logic operation, or a combination thereof to the antenna element signal 306 and the testing step signal 308 to determine the testing state signal 312 or the corresponding testing state.

Figure 4A:
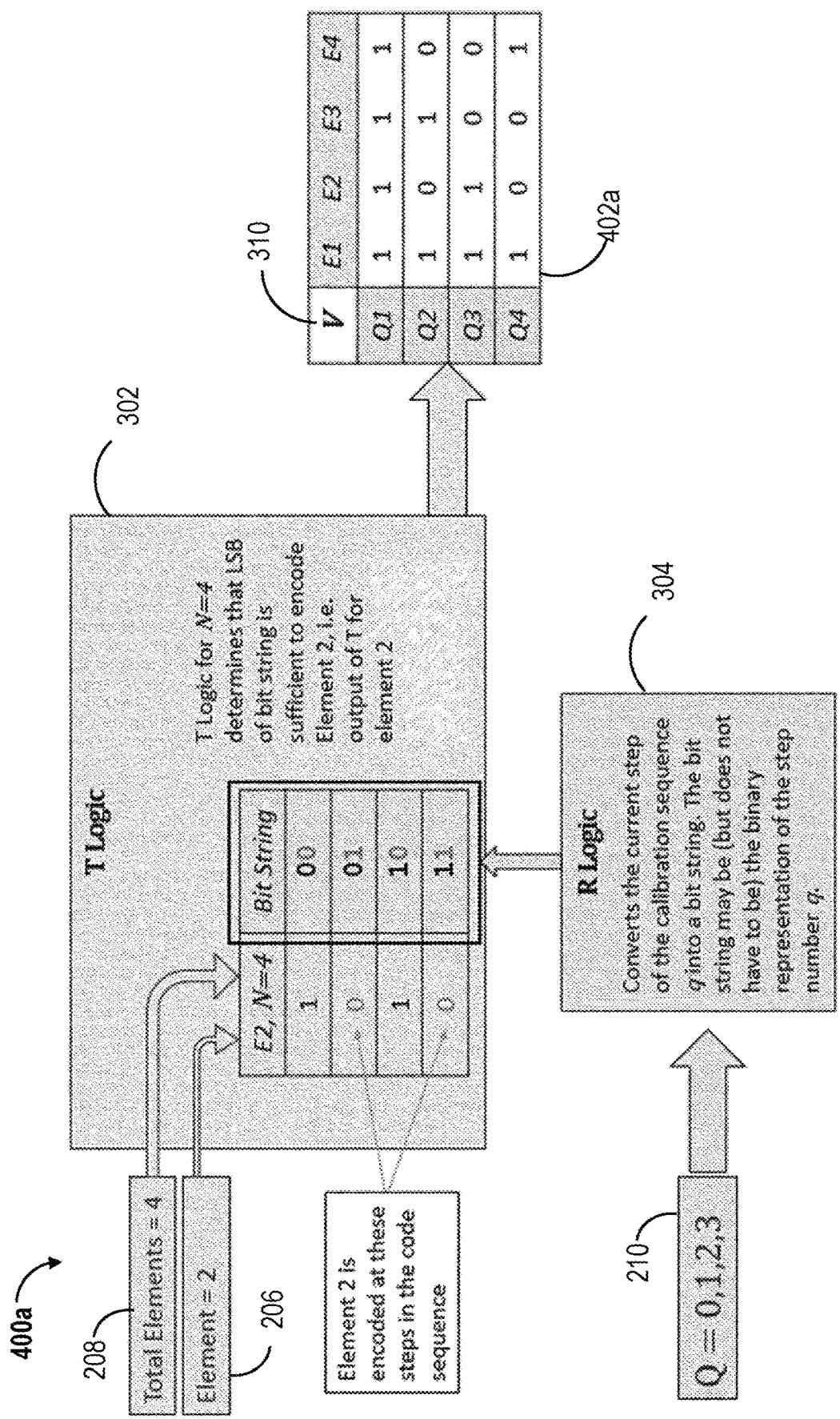
FIGS. 4A-4C show diagrams illustrating various examples of logic-operations-based implementation of the testing sequence generation logic, according to inventive concepts of this disclosure.

Referring to FIG. 4A, a diagram illustrating a first example logic-operations-based implementation 400a of the first logic 302, the second logic 304, and the combiner component 310 of FIG. 3 is shown, according to inventive concepts of this disclosure. In FIG. 4A, "T Logic" refers to the first logic 302, "R Logic," refers to the second logic 304, and "V" refers to the combiner component 310 (or operations associated therewith). The phased antenna array 104 is assumed to include 4 antenna elements 110 denoted as E1, E2, E3, and E4 (or with antenna element IDs equal to 0, 1, 2, and 3), respectively. There are four testing steps denoted as Q1, Q2, Q3, and Q4 (or with corresponding testing step IDs Q=0, 1, 2 and 3), respectively.

A testing matrix, such as the matrix 402a can represent the state of each antenna element (of the elements denoted as E1, E2, E3 and E4) at each testing step (of the steps denoted as Q1, Q2, Q3 and Q4). In the matrix 402, 0 indicates that the corresponding antenna element is ON (or in a testing state) at the corresponding testing step, whereas 1 represents an OFF state (or nominal state) of the corresponding antenna element at the corresponding testing step. The combination of the first logic 302 (or "T Logic"), the second logic 304 (or "R Logic"), and combiner component 310 (or "V") can be configured to generate the entries of the testing matrix 402a, e.g., as testing state signals. In other words, the output of the testing generation logic 214 over the sequence of testing steps for the antenna elements 110 can emulate the testing matrix 402a.

The first logic 302 can associate the antenna element signals 306 (or the binary codes) 00, 01, 10 and 11 with the antenna elements denoted as E1, E2, E3 and E4, respectively. The second logic 304 can associate the testing step signals 308 (or the binary codes) 00, 01, 10 and 11 with the testing steps denoted as Q1, Q2, Q3 and Q4, respectively. The combiner component 310 (or "V") can apply a logic AND operation on any pair of signals including an antenna element signal 306 and a testing step signal 308 and then count the number of ones in resulting product of the AND operation. If the number of ones is odd, the corresponding testing state signal (or testing state) is ON (or 0), otherwise it is OFF (or 1). The values of the testing matrix 402a can be viewed as the testing signals for the various antenna elements 110 at various testing steps. The testing matrix 402a in this case is a Hadamard matrix. In some implementations, the testing matrix representing testing state signals generated by the testing sequence generation logic 214 (or testing states of the antenna elements 110 across the sequence of testing steps) can take other forms.

Figure 4B:
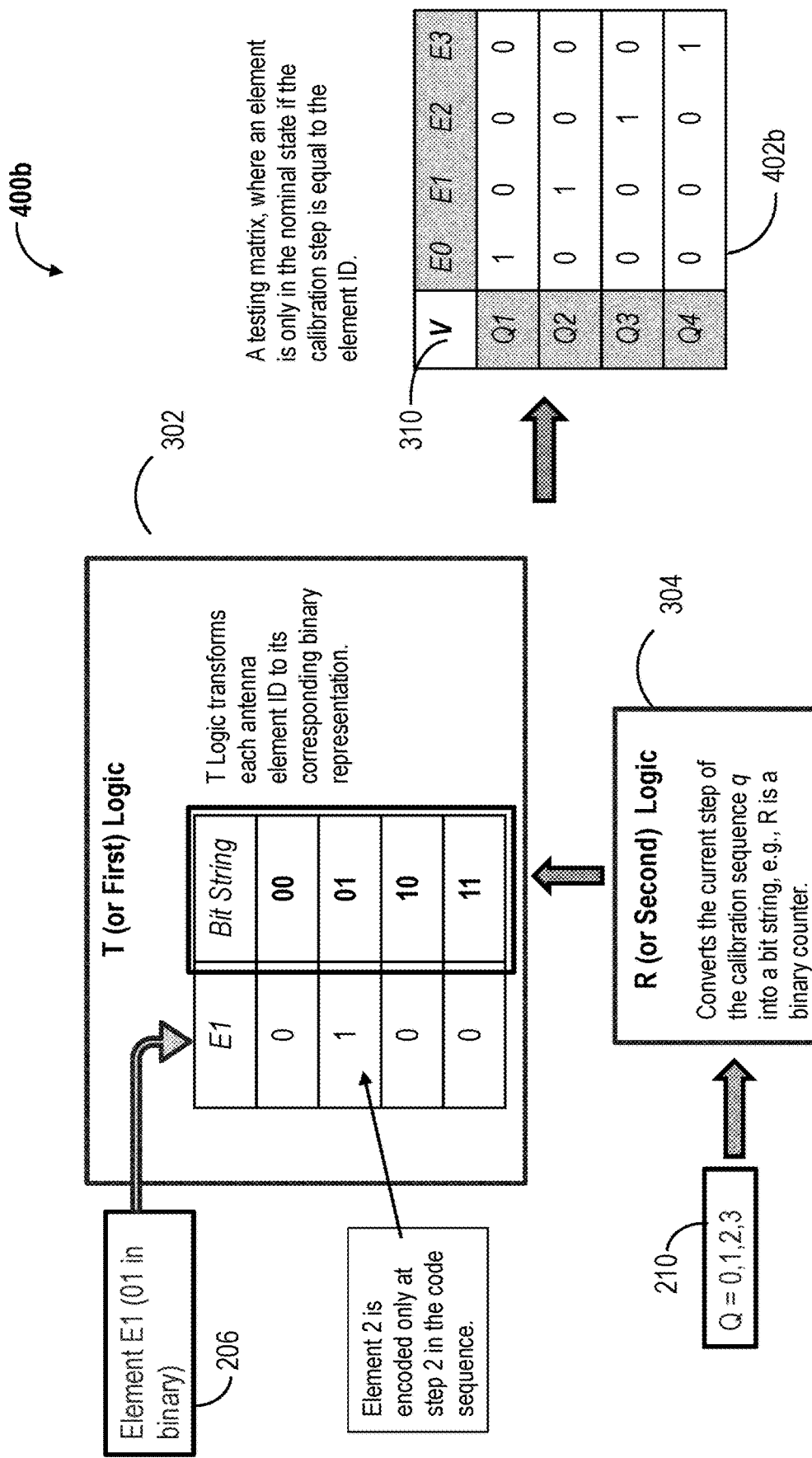

Referring to FIG. 4B, a diagram illustrating a second example logic-operations-based implementation 400b of the first logic 302, the second logic 304, and the combiner component 310 of FIG. 3 is shown, according to inventive concepts of this disclosure. In FIG. 4B, similar to FIG. 4A, "T Logic" refers to the first logic 302, "R Logic," refers to the second logic 304, and "V" refers to the combiner component 310 (or operations associated therewith). Also, similar to the example in FIG. 4A, the phased antenna array 104 is assumed to include 4 antenna elements 110 denoted as E1, E2, E3, and E4 (or with antenna element IDs equal to 0, 1, 2, and 3), respectively, and there are four testing steps denoted as (or with corresponding testing step IDs equal to Q=0, 1, 2, and 3), respectively.

The testing matrix 402b, which represents the state of each antenna element (of the elements denoted as E1, E2, E3 and E4) at each testing step (of the steps denoted as Q1, Q2, Q3 and Q4), is an identity matrix in this case. The values of the testing matrix 402b can be viewed as the testing signals for the various antenna elements 110 at various testing steps. In the matrix 402b, 0 indicates that the corresponding antenna element is OFF (or in nominal state) at the corresponding testing step, whereas 1 represents an ON state (or a testing state) of the corresponding antenna element at the corresponding testing step. The combination of the first logic 302 (or "T Logic"), the second logic 304 (or "R Logic"), and combiner component 310 (or "V") can be configured to generate the entries of the testing matrix 402b, such that an antenna element is in the nominal state only when the corresponding antenna element ID is equal to (or matches) the testing step ID. For instance, the combiner component 310 can be a comparator that detects when the antenna element signal (generated by the first logic for a given antenna element) matches the testing step signal (provided by the second logic for a given testing step). The first logic 302, in this case, can associate the antenna element signals 306 (or the binary codes) 00, 01, 10 and 11 with the antenna elements denoted as E1, E2, E3 and E4 (or having corresponding antenna element IDs equal to 0, 1, 2, and 3), respectively. The second logic 304 can associate the testing step signals 308 (or the binary codes) 00, 01, 10 and 11 with the testing steps denoted as Q1, Q2, Q3 and Q4 (or having testing sequence ID Q=0, 1, 2, or 3), respectively.

Figure 4C:
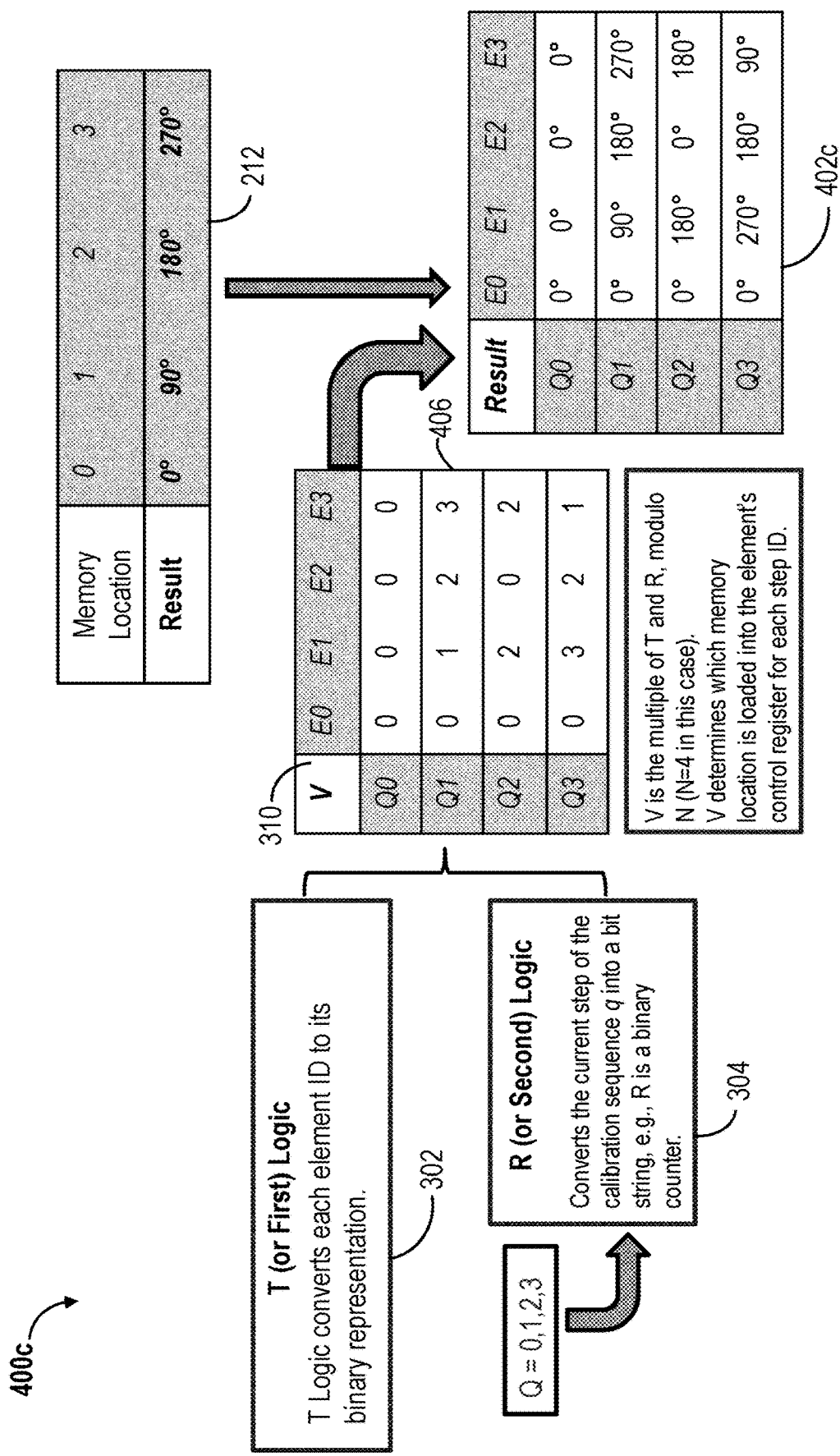

Referring to FIG. 4C, a diagram illustrating a third example logic-operations-based implementation 400c of the first logic 302, the second logic 304, and the combiner component 310 of FIG. 3 is shown, according to inventive concepts of this disclosure. In FIG. 4C, similar to FIGS. 4A and 4B, "T Logic" refers to the first logic 302, "R Logic," refers to the second logic 304, and "V" refers to the combiner component 310 (or operations associated therewith). Also, similar to the examples in FIGS. 4A and 4B, the phased antenna array 104 is assumed to include 4 antenna elements 110 denoted as E1, E2, E3, and E4 (or with corresponding antenna element IDs equal to 0, 1, 2, and 3), respectively, and there are four testing steps denoted as Q1, Q2, Q3 and Q4 (or with corresponding testing step IDs Q=0, 1, 2, and 3), respectively.

In this case, for a phased antenna array having M antenna elements 110 (e.g., M=4), the antenna elements 110 can be configured with any of M uniformly spaced phase shift values within 0 to 360°. One or more memory registers 212 can store the M uniformly spaced phase shift values representing possible testing states for the antenna elements 110. The one or more registers 212 can be common to all antenna elements 110. The first logic 302 can associate the antenna element signals 306 (or the binary codes) 00, 01, 10 and 11 with the antenna elements denoted as E1, E2, E3 and E4 (or having antenna element ID E=0, 1, 2, or 3), respectively. The second logic 304 can associate the testing step signals 308 (or the binary codes) 00, 01, 10 and 11 with the testing steps denoted as Q1, Q2, Q3 and Q4 (or having testing sequence ID Q=0, 1, 2, or 3), respectively.

The combiner component 310 can be a multiplier configured to multiply, for each antenna element and each testing step, the corresponding antenna element signal (generated by the first logic) with the corresponding testing step signal (provided by the second logic). The result of the multiplication, as shown in matrix 406, can represent the testing signal indicative of an entry or an index of a memory location of the one or more memory registers 212 from which a phase shift value is to be retrieved to configure a given antenna element 110 at a given testing step. The testing matrix 402c shows, for each antenna element and each testing step, the phase shift value (or the testing signal) to be applied to that antenna element 110 during that testing step. The examples 400a-400c of FIGS. 4A-4C are shown as illustrative example implementations of the testing sequence generation logic 214. Other implementations of the testing sequence generation logic 214, the first logic 302, the second logic 304, or any combination thereof is contemplated by the current disclosure. For instance, the testing signals for the various antenna elements at various testing steps can be generated in various ways based on the antenna element IDs and the testing step IDs.

Referring back to FIGS. 2 and 3, the testing control logic 216 can receive an indication of the operation mode (or the testing control value) from the memory register 204, and receive the testing state signal 312 from the testing sequence generation logic 214 to identify a corresponding testing state of the antenna element 110 identified by the antenna element ID during the testing state identified by the testing state ID. The testing control logic 216 can determine the testing state corresponding to the testing state signal 312 if the operation mode is testing mode and not nominal or normal operation mode. The testing control logic 216 can cause the antenna element 110 identified by the antenna element ID to be configured with the testing parameters (e.g., gain, time delay or phase shift) associated with the identified testing mode. In the case of nominal or normal operation mode, the testing control logic 216 can take no further action or prevent configuration of the antenna elements with corresponding testing parameters.

The increment condition detector 218 can include a circuit or device to a detect condition for incrementing (or modifying or updating) the testing step ID in the memory register 210 to refer to a following testing step ID. For example, the increment condition detector 218 can cause the testing step ID to be incremented by 1 modulo the maximum number of testing steps. The increment condition detector 218 can cause the testing step ID to be incremented (or decremented) by various numbers modulo the maximum number of testing steps as long as the testing step ID goes loops through all the possible corresponding values.

Figure 5:
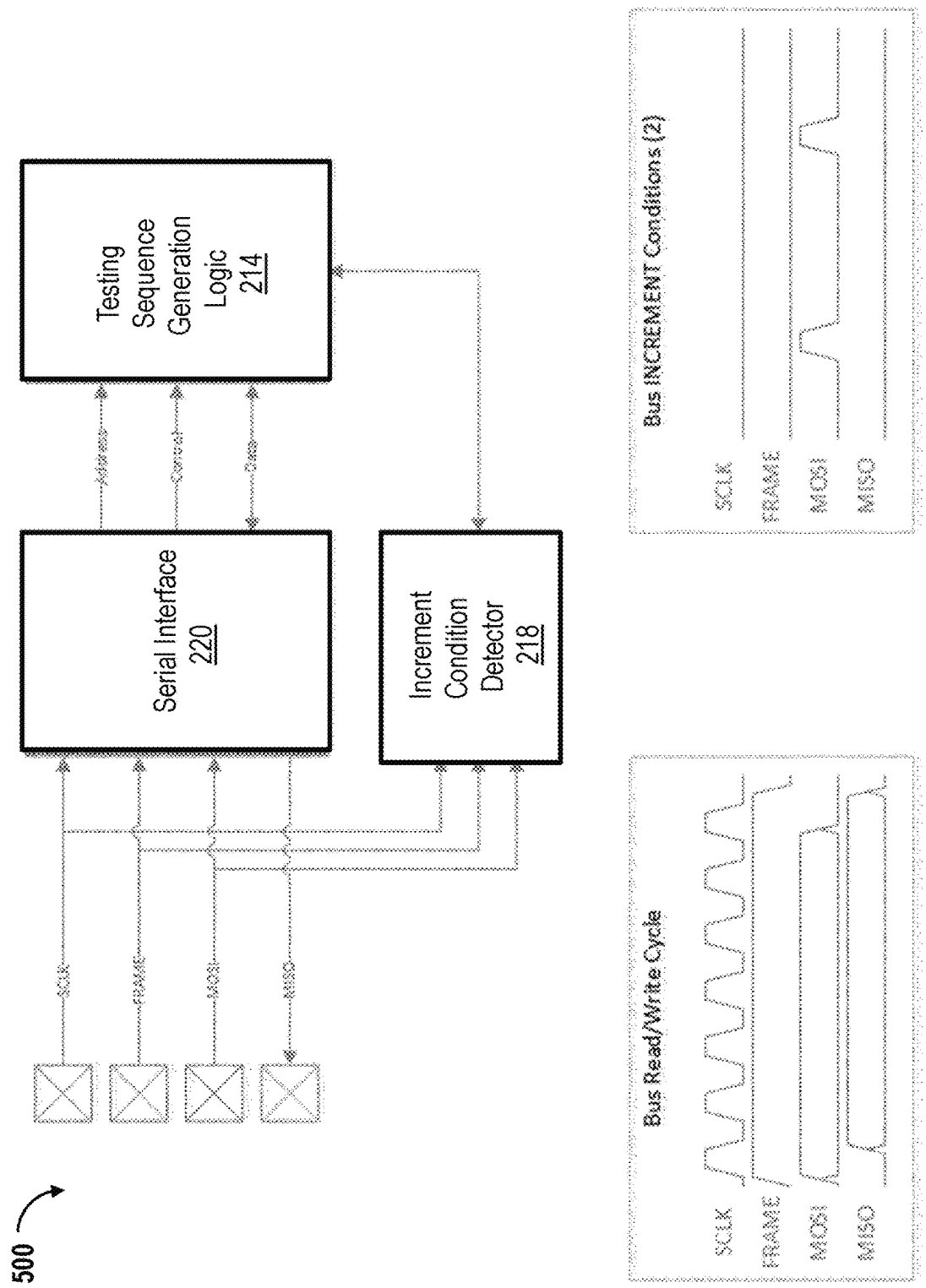
FIG. 5 shows a block diagram illustrating an example incrementing process of a testing step ID, according to inventive concepts of this disclosure.

Referring to FIG. 5, a block diagram illustrating an example incrementing process 500 of the testing step ID is shown, according to inventive concepts of this disclosure. The incrementing process 500 can include using already existing signal of the integrated circuit (e.g., beamformer IC 112) to define and detect the condition for incrementing or updating the testing step ID. The increment condition detector 218 can receive the SCLK (e.g., clock) signal, the FRAME signal and the master-out-slave-in (MOSI) signal to define and detect the incrementing condition for the testing step ID. For example, the increment condition detector 218 can detect an increment (or update) condition when the MOSI signal transitions from low to high while both the SLCK and FRAME signals are at low state. The incrementing process 500 allows for a mechanism of incrementing the testing step ID without requiring a separate increment signal as input. Other approaches for incrementing the testing step ID can include using a separate increment input signal to the increment condition detector 218 or the register 210, or using a separate register block and incrementing the testing step ID when the value in the separate register block is equal to a specific (or predefined) value.

Figure 6:
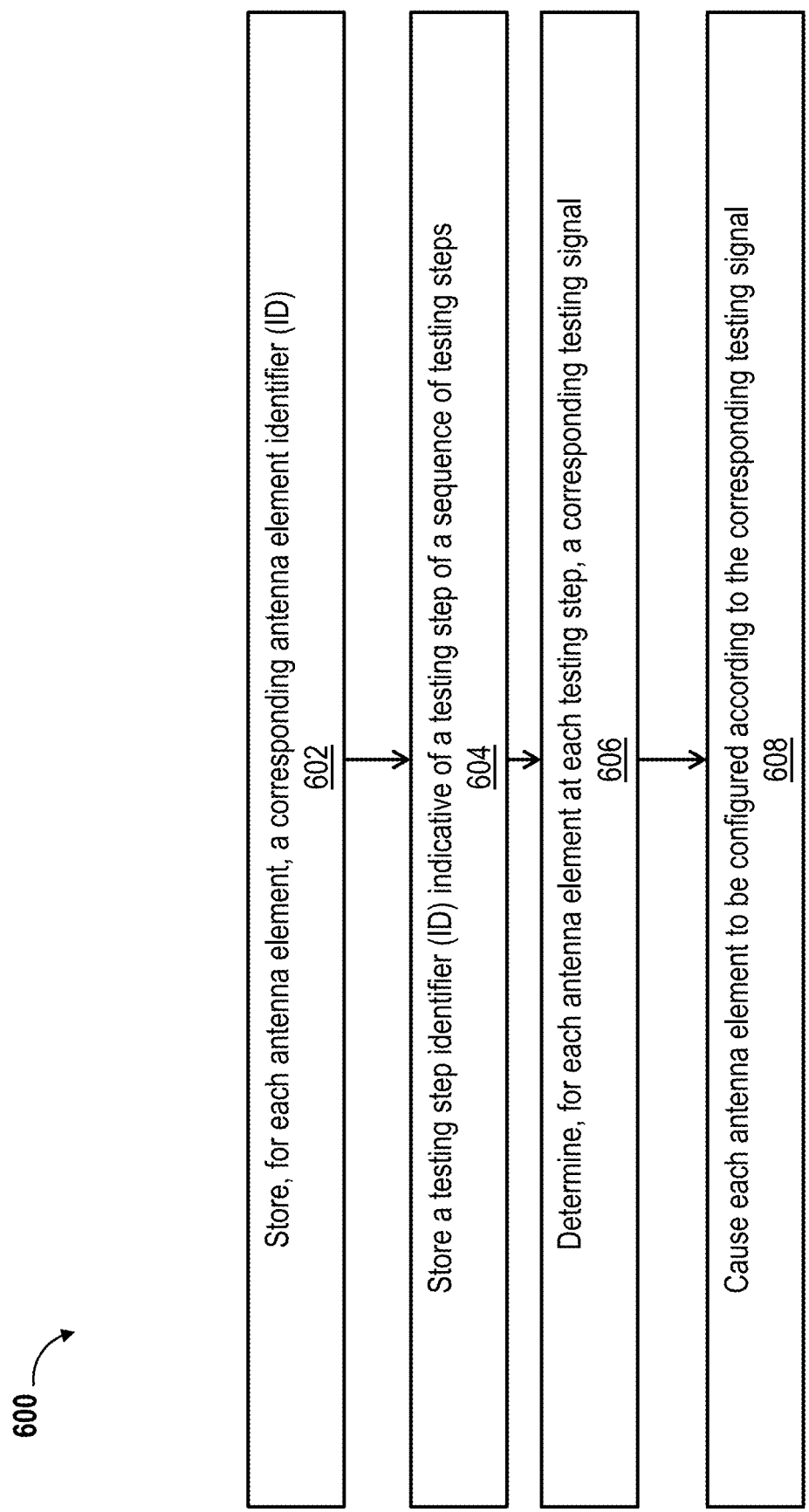
FIG. 6 shows a flowchart of a method for testing phased antenna arrays, according to inventive concepts of this disclosure.

Referring to FIG. 6, a flowchart of a method 600 for testing phased antenna arrays, according to inventive concepts of this disclosure. The method 600 can include storing, for each antenna element of a plurality of antenna elements of the phased antenna array, a corresponding antenna element identifier (ID) (BLOCK 602). The method 600 can include storing a testing step identifier (ID) indicative of a testing step of a sequence of testing steps (BLOCK 604). The method 600 can include determining for each antenna element of the plurality of antenna elements of the phased antenna array, using the corresponding antenna element ID and the testing step ID, a corresponding testing signal indicative of a testing state of the antenna element during the testing step indicated by the testing step ID (BLOCK 606). The method 600 can include causing each antenna element of the plurality of antenna elements of the phased antenna array to be configured according to the corresponding testing signal during the testing step indicated by the testing step ID (BLOCK 606).

The method 600 can include an integrated circuit (IC), such as an IC associated with a beamformer (e.g., beamformer IC 112 or testing circuit 112 shown in FIG. 1) of a phased antenna array, storing for each antenna element of a plurality of antenna elements of the phased antenna array, a corresponding antenna element identifier (ID) (BLOCK 602). The IC can include memory registers (or memory elements) configured to store for each antenna element 110 a corresponding antenna element ID. The antenna element ID for each antenna element can be a number, a character, or other form of identifier.

The method 600 can include the IC storing a testing step identifier (ID) indicative of a testing step of a sequence of testing steps (BLOCK 604). For instance, the IC can include a memory register (or memory element) to store an ID of a current testing step. The step ID for each testing can be a number, a character, or other form of identifier. The testing step ID can be sequentially incremented (or modified) as the IC switches from one testing step to another, for example, as discussed with regard to FIG. 5 above.

The method 600 can include the IC determining for each antenna element of the plurality of antenna elements of the phased antenna array, using the corresponding antenna element ID and the testing step ID, a corresponding testing signal indicative of a testing state of the antenna element during the testing step indicated by the testing step ID (BLOCK 606). The IC can include one or more logics (e.g., circuits, executable instructions, or combinations thereof to perform one or more logical operations or functions) to generate a testing signal for each pair of IDs including an antenna element ID and a testing sequence ID. The one or more logics can operate, for example, as discussed with regard to FIGS. 2-5. For each antenna element—testing step pair, the corresponding testing signal can be indicative of the testing state (or configuration parameters such as gain, phase shift, time delay or a combination thereof) of the antenna element at the testing step.

The method 600 can include the IC causing each antenna element of the plurality of antenna elements of the phased antenna array to be configured according to the corresponding testing signal during the testing step indicated by the testing step ID (BLOCK 606). The IC can use the testing signal, for each antenna element—testing step pair, to determine the configuration parameter(s) (e.g., gain, phase shift, time delay, or a combination thereof) to be applied to the antenna element 110 at the testing step. The IC can configure the determined configuration parameter(s) to the antenna element during the testing step.

The method 600 can be performed by the phased antenna array 104 (shown in FIG. 1) or an integrated circuit thereof, e.g., beamformer IC 112 or the phased antenna array testing circuit 114 (shown in FIG. 1), as discussed above with regard to FIGS. 1-5. In the method 600, the phased antenna array 104 (shown in FIG. 1), or ICs (e.g., beamformer IC 112 or testing circuit 114) associated with the phased antenna array 104, the testing sequence generation logic 214 can be implemented as a single logic or as a combinations of logics (e.g., a combination of first logic 302 and second logic 304 as discussed with regard to FIGS. 3-4C). While embodiments in the current disclosure are described in terms of a phased antenna array, these embodiments can also apply to antenna arrays where antenna elements are to be configured with gain values only (e.g., no phase shift).

The construction and arrangement of the systems and methods are described herein as illustrative examples and are not to be construed as limiting. Although only a few embodiments have been described in detail in this disclosure, many modifications are possible (e.g., variations in sizes, dimensions, structures, shapes and proportions of the various elements, values of parameters, mounting arrangements, use of materials, colors, orientations). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method of operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

What is claimed is:

1. An antenna array testing circuit for testing a phased antenna array, the antenna array testing circuit comprising:
   a plurality of memory, registers to:
     store, for each antenna element of a plurality of antenna elements of the phased antenna array, a corresponding antenna element identifier (ID);
     store a testing step identifier (ID) indicative of a testing step of a sequence of testing steps;
   a testing sequence generation logic configured to determine, for each antenna element of the plurality of antenna elements of the phased antenna array, using a combination of the corresponding antenna element ID and the testing step ID, a corresponding testing signal indicative of a testing state of the antenna element during the testing step indicated by the testing step ID; and
   a testing control logic configured to cause, each antenna element of the plurality of antenna elements of the phased antenna array, to be configured according to the corresponding testing signal during the testing step indicated by the testing step ID;
   wherein testing signals generated by the testing sequence generation logic and indicative of testing states of the plurality of antenna elements across the sequence of testing steps represent a testing matrix; and
   wherein the antenna array testing circuit is integrated in an integrated circuit IC of the phased antenna array.

2. The antenna array testing circuit of claim 1, wherein the testing sequence generation logic includes:
   a first logic to determine, for each antenna element of the plurality of antenna elements of the phased antenna array, a corresponding antenna element signal using the corresponding antenna element ID;
   a second logic to determine, for each testing step of the sequence of testing steps, a corresponding testing step signal using the testing step ID,
   the testing sequence generation logic to generate, using the corresponding testing step signal and the corresponding antenna element signal, the corresponding testing signal indicative of a testing state of the antenna element during the testing step indicated by the testing step ID.

3. The antenna array testing circuit of claim 1 further comprising:
   a memory to store, for each testing step of the sequence of testing steps and for each antenna element of the plurality of antenna elements, a corresponding indication of the testing state of the antenna elements during the testing step,
   the testing sequence generation logic to retrieve, for each antenna element of the plurality of antenna elements, at each testing step of the sequence of testing steps, the corresponding indication of the testing state of the antenna element from the memory, and generate the corresponding testing signal indicative of the testing state of the antenna element during the testing step using the corresponding indication of the testing state of the antenna element.

4. The antenna array testing circuit of claim 1, wherein the testing state of the antenna element is indicative of at least one of a gain, a time delay, and a phase shift to be applied to the antenna element.

5. The antenna array testing circuit of claim 1, wherein the plurality of memory registers store, for each antenna element of the plurality of antenna elements of the phased antenna array, at least one of a corresponding testing phase, a corresponding time delay, and a corresponding testing gain.

6. The antenna array testing circuit of claim 1, wherein the plurality of memory registers store a testing control value indicative of whether each antenna element is in a testing state or not.

7. The antenna array testing circuit of claim 6, wherein the testing control logic is configured to:
   receive the testing control value; and
   allow configuration of the plurality of antenna elements of the phased antenna array if the testing control value is indicative of a testing state, otherwise prevent configuration of the plurality of antenna elements of the phased antenna array.

8. The antenna array testing circuit of claim 1, further comprising an increment condition detector logic configured to:
   detect occurrence of a predefined condition; and
   cause the testing step ID to be modified to refer to another testing step of the plurality of testing steps, upon detecting the occurrence of the predefined condition.

9. A method of testing a phased antenna array using a testing circuit integrated in an integrated circuit of the phased antenna array, the method comprising:
   storing, by a plurality of memory registers, for each antenna element of a plurality of antenna elements of the phased antenna array, a corresponding antenna element identifier (ID);
   storing, by the plurality of memory registers, a testing step identifier (ID) indicative of a testing step of a sequence of testing steps;
   determining, by the integrated circuit, for each antenna element of the plurality of antenna elements of the phased antenna array, using a combination of the corresponding antenna element ID and the testing step ID, a corresponding testing signal indicative of a testing state of the antenna element during the testing step indicated by the testing step; and causing, by the integrated circuit, each antenna element of the plurality of antenna elements of the phased antenna array to be configured according to the corresponding testing signal during the testing step indicated by the testing step ID;

wherein testing signals generated by the testing sequence generation logic and indicative of testing states of the plurality of antenna elements across the sequence of testing steps represent a testing matrix.

10. The method of claim 9, further comprising:

determining, by the integrated circuit, for each testing step of the sequence of testing steps, a corresponding testing step signal using the testing step ID;

determining, by the integrated circuit, for each antenna element of the plurality of antenna elements of the phased antenna array a corresponding antenna element signal using the corresponding antenna element ID, generating the corresponding testing signal indicative of the testing state of the antenna element during the testing step indicated by the testing step ID includes generating the corresponding testing signal using the corresponding testing step signal and the corresponding antenna element signal.

11. The method of claim 9 further comprising:

storing, in a memory, for each testing step of the sequence of testing steps and for each antenna element of the plurality of antenna elements, a corresponding indication of the testing state of the antenna elements during the testing step;

retrieving, by the integrated circuit, for each antenna element of the plurality of antenna elements, at each testing step of the sequence of testing steps, the corresponding indication of the testing state of the antenna element from the memory; and generating, by the integrated circuit, the corresponding testing signal indicative of the testing state of the antenna element during the testing step using the corresponding indication of the testing state of the antenna element.

12. The method of claim 9, wherein the testing state is indicative of at least one of a gain, a time delay, and a phase shift to be applied to the antenna element.

13. The method of claim 9, further comprising:

storing, by the plurality of memory registers, for each antenna element of the plurality of antenna elements of the phased antenna array, at least one of a corresponding phase shift, a corresponding time delay, and a corresponding gain.

14. The method of claim 9, further comprising:

storing, by the plurality of memory registers, a testing control value indicative of whether each antenna element is in a testing state or not.

15. The method of claim 14, further comprising:

retrieving the testing control value from the plurality of the memory registers; and allowing configuration of the plurality of antenna elements of the phased antenna array if the testing control value is indicative of a testing state, otherwise preventing configuration of the plurality of antenna elements of the phased antenna array.

16. The method of claim 9, further comprising:

detecting, by the integrated circuit, occurrence of a predefined condition; and causing, by the integrated circuit, the testing step ID to be modified to refer to another testing step of the plurality of testing steps, upon detecting the occurrence of the predefined condition.

17. A phased antenna array comprising:

an antenna array testing circuit integrated in an integrated circuit of the phased antenna array;

a plurality of antenna elements; and a plurality of memory registers of the antenna array testing circuit configured to:
store, for each antenna element of the plurality of antenna elements of the phased antenna array, a corresponding antenna element identifier (ID);
store a testing step identifier (ID) indicative of a testing step of a sequence of testing steps, a testing sequence generation logic integrated in the integrated circuit of the phased antenna army and configured to determine, for each antenna element of the plurality of antenna elements of the phased antenna array, using a combination of the corresponding antenna element ID and the testing step ID, a corresponding testing signal indicative of a testing state of the antenna element during the testing step indicated by the testing step ID; and a testing control logic integrated in the integrated circuit of the phased antenna array and configured to cause, each antenna element of the plurality of antenna elements of the phased antenna array, to be configured according to the corresponding testing signal during the testing step indicated by the testing step ID;

wherein testing signals generated by the testing sequence generation logic and indicative of testing states of the plurality of antenna elements across the sequence of testing steps represent a testing matrix.

* * * * *